(12) United States Patent
Rad

(10) Patent No.: US 11,855,056 B1
(45) Date of Patent: Dec. 26, 2023

(54) LOW COST SOLUTION FOR 2.5D AND 3D PACKAGING USING USR CHIPLETS

(71) Applicant: NuConcepts Holdings LLC, Las Vegas, NV (US)

(72) Inventor: Mohsen F. Rad, Las Vegas, NV (US)

(73) Assignee: Eliyan Corporation, Santa Clara, CA (US)

( * ) Notice: Subject to any disclaimer, the term of this patent is extended or adjusted under 35 U.S.C. 154(b) by 136 days.

(21) Appl. No.: 16/812,234

(22) Filed: Mar. 6, 2020

Related U.S. Application Data

(60) Provisional application No. 62/941,461, filed on Nov. 27, 2019, provisional application No. 62/818,752, filed on Mar. 15, 2019.

(51) Int. Cl.
*H01L 23/538* (2006.01)
*H01L 25/18* (2023.01)
*H01L 23/00* (2006.01)

(52) U.S. Cl.
CPC .......... *H01L 25/18* (2013.01); *H01L 23/5384* (2013.01); *H01L 24/06* (2013.01); *H01L 24/14* (2013.01); *H01L 24/20* (2013.01)

(58) Field of Classification Search
CPC ..... H01L 25/18; H01L 23/5384; H01L 24/06; H01L 24/14; H01L 24/20
USPC .......................................... 257/737; 438/613
See application file for complete search history.

(56) References Cited

U.S. PATENT DOCUMENTS

| 6,031,729 | A | 2/2000 | Berkely |
|---|---|---|---|
| 6,417,737 | B1 | 7/2002 | Moloudi |
| 6,690,742 | B2 | 2/2004 | Chan |
| 6,721,313 | B1 | 4/2004 | Van Duyne |
| 6,932,618 | B1 | 8/2005 | Nelson |
| 7,027,529 | B1 | 4/2006 | Ohishi |
| 7,248,890 | B1 | 7/2007 | Raghavan |
| 7,269,212 | B1 | 9/2007 | Chau |
| 7,477,615 | B2 | 1/2009 | Oshita |
| 7,535,958 | B2 | 5/2009 | Best |
| 7,978,754 | B2 | 7/2011 | Yeung |
| 8,004,330 | B1 | 8/2011 | Acimovic |
| 8,024,142 | B1 | 9/2011 | Gagnon |
| 8,121,541 | B2 | 2/2012 | Rofougaran |
| 8,483,579 | B2 | 7/2013 | Fukuda |
| 8,546,955 | B1 | 10/2013 | Wu |
| 8,861,573 | B2 | 10/2014 | Chu |
| 8,948,203 | B1 | 2/2015 | Nolan |
| 8,982,905 | B2 | 3/2015 | Kamble |
| 9,088,334 | B2 | 7/2015 | Chakraborty |
| 9,129,935 | B1 * | 9/2015 | Chandrasekar ......... H01L 23/50 |

(Continued)

OTHER PUBLICATIONS

U.S. Appl. No. 16/812,234; Mohsen F. Rad, filed Mar. 6, 2020.

*Primary Examiner* — Didarul A Mazumder
(74) *Attorney, Agent, or Firm* — Lance Kreisman; Peninsula Patent Group

(57) ABSTRACT

Systems and methods are provided for a system in a package (SiP) connectivity using one or more ultra short reach (USR) chiplets. The USR chiplet can receive/transmit data at a lower throughput and transmit/receive that data at a higher throughput over ultra short distances. The USR chiplet can be connected to a main integrated circuit (IC) using a high density interconnect or integrated with the main IC in a mold material. The USR chip can enable the main IC to transfer data over a substrate at a higher speed using a fewer number of traces.

18 Claims, 13 Drawing Sheets

(56) References Cited

U.S. PATENT DOCUMENTS

| | | |
|---|---|---|
| 9,294,313 B2 | 3/2016 | Prokop |
| 9,349,707 B1 * | 5/2016 | Sun .................. H01L 23/49827 |
| 9,379,878 B1 | 6/2016 | Lugthart |
| 9,432,298 B1 | 8/2016 | Smith |
| 9,832,006 B1 | 11/2017 | Bandi |
| 9,886,275 B1 | 2/2018 | Carlson |
| 9,961,812 B2 | 5/2018 | Suorsa |
| 10,171,115 B1 | 1/2019 | Shirinfar |
| 10,439,661 B1 | 10/2019 | Heydari |
| 10,642,767 B1 | 5/2020 | Farjadrad |
| 10,735,176 B1 | 8/2020 | Heydari |
| 10,855,498 B1 | 12/2020 | Farjadrad |
| 11,088,876 B1 | 8/2021 | Farjadrad |
| 2002/0122479 A1 | 9/2002 | Agazzi |
| 2002/0136315 A1 | 9/2002 | Chan |
| 2004/0088444 A1 | 5/2004 | Baumer |
| 2004/0113239 A1 | 6/2004 | Prokofiev |
| 2004/0130347 A1 | 7/2004 | Moll |
| 2004/0156461 A1 | 8/2004 | Agazzi |
| 2005/0041683 A1 | 2/2005 | Kizer |
| 2005/0134306 A1 | 6/2005 | Stojanovic |
| 2005/0157781 A1 | 7/2005 | Ho |
| 2005/0205983 A1 | 9/2005 | Origasa |
| 2006/0060376 A1 | 3/2006 | Yoon |
| 2006/0103011 A1 | 5/2006 | Andry |
| 2006/0158229 A1 | 7/2006 | Hsu |
| 2006/0181283 A1 | 8/2006 | Wajcer |
| 2006/0188043 A1 | 8/2006 | Zerbe |
| 2006/0250985 A1 | 11/2006 | Baumer |
| 2006/0251194 A1 | 11/2006 | Bublil |
| 2007/0281643 A1 | 12/2007 | Kawai |
| 2008/0063395 A1 | 3/2008 | Royle |
| 2008/0143422 A1 | 6/2008 | Lalithambika |
| 2008/0186987 A1 | 8/2008 | Baumer |
| 2008/0222407 A1 | 9/2008 | Carpenter |
| 2009/0113158 A1 | 4/2009 | Schnell |
| 2009/0154365 A1 | 6/2009 | Diab |
| 2009/0174448 A1 | 7/2009 | Zabinski |
| 2009/0220240 A1 | 9/2009 | Abhari |
| 2009/0225900 A1 | 9/2009 | Yamaguchi |
| 2009/0304054 A1 | 12/2009 | Tonietto |
| 2010/0177841 A1 | 7/2010 | Yoon |
| 2010/0197231 A1 | 8/2010 | Kenington |
| 2010/0294547 A1 | 11/2010 | Hatanaka |
| 2011/0029803 A1 | 2/2011 | Redman-White |
| 2011/0038286 A1 | 2/2011 | Ta |
| 2011/0167297 A1 | 7/2011 | Su |
| 2011/0187430 A1 | 8/2011 | Tang |
| 2011/0204428 A1 | 8/2011 | Erickson |
| 2011/0267073 A1 | 11/2011 | Chengson |
| 2011/0293041 A1 | 12/2011 | Luo |
| 2012/0082194 A1 | 4/2012 | Tam |
| 2012/0182776 A1 | 7/2012 | Best |
| 2012/0192023 A1 | 7/2012 | Lee |
| 2012/0216084 A1 | 8/2012 | Chun |
| 2012/0327818 A1 | 12/2012 | Takatori |
| 2013/0222026 A1 | 8/2013 | Havens |
| 2013/0249290 A1 | 9/2013 | Buonpane |
| 2013/0285584 A1 | 10/2013 | Kim |
| 2014/0016524 A1 | 1/2014 | Choi |
| 2014/0048947 A1 * | 2/2014 | Lee ..................... H01L 23/5384 257/777 |
| 2014/0126613 A1 | 5/2014 | Zhang |
| 2014/0192583 A1 | 7/2014 | Rajan |
| 2014/0269860 A1 | 9/2014 | Brown |
| 2014/0269983 A1 | 9/2014 | Baeckler |
| 2015/0012677 A1 | 1/2015 | Nagarajan |
| 2015/0172040 A1 | 6/2015 | Pelekhaty |
| 2015/0180760 A1 | 6/2015 | Rickard |
| 2015/0206867 A1 * | 7/2015 | Lim ..................... G11C 29/025 257/676 |
| 2015/0271074 A1 | 9/2015 | Hirth |
| 2015/0326348 A1 | 11/2015 | Shen |
| 2015/0358005 A1 | 12/2015 | Chen |
| 2016/0056125 A1 * | 2/2016 | Pan ..................... H01L 25/0652 257/676 |
| 2016/0071818 A1 | 3/2016 | Wang |
| 2016/0111406 A1 * | 4/2016 | Mak ....................... H01L 25/18 257/773 |
| 2016/0217872 A1 | 7/2016 | Hossain |
| 2016/0294585 A1 | 10/2016 | Rahman |
| 2017/0317859 A1 | 11/2017 | Hormati |
| 2017/0331651 A1 | 11/2017 | Suzuki |
| 2018/0010329 A1 | 1/2018 | Golding, Jr. |
| 2018/0175001 A1 * | 6/2018 | Pyo ..................... H01L 21/4857 |
| 2018/0190635 A1 * | 7/2018 | Choi ................... H01L 25/0657 |
| 2019/0044764 A1 * | 2/2019 | Hollis .................. G11C 7/1084 |
| 2019/0058457 A1 | 2/2019 | Ran |
| 2019/0108111 A1 | 4/2019 | Levin |
| 2019/0198489 A1 * | 6/2019 | Kim ..................... H01L 23/481 |

* cited by examiner

US 11,855,056 B1

LOW COST SOLUTION FOR 2.5D AND 3D PACKAGING USING USR CHIPLETS

CROSS-REFERENCE TO RELATED APPLICATIONS

This application is non-provisional and claims priority to U.S. Provisional Application No. 62/818,752, filed Mar. 14, 2019, entitled "a novel solution for low-cost 2.5D semiconductor packaging/integration with high-throughput inter-die connectivity using chips embedded in substrate" and U.S. Provisional Application No. 62/941,461, filed Nov. 27, 2019, entitled "a novel solution for low-cost 2.5D & 3D packaging using embedded multi-Gbps USR chiplets" which are incorporated herein by reference in their entirety for all purposes.

TECHNICAL FIELD

This disclosure generally relates to semiconductor packaging, in particular, inter-die connectivity in a system in package (SiP).

DETAILED DESCRIPTION

Figure 1:
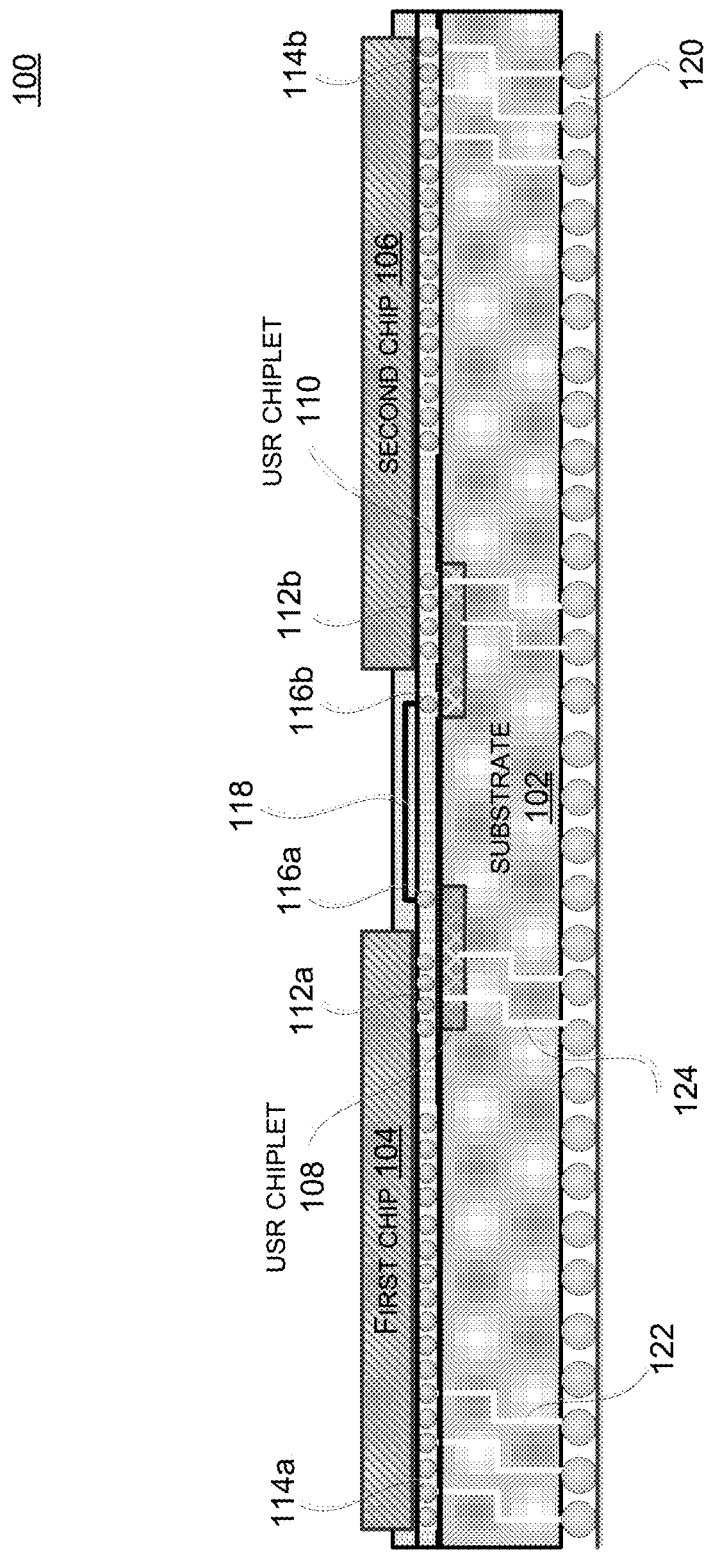
FIG. 1 illustrates a cross-sectional view of a system-in-package (SiP) comprising ultra short reach (USR) chiplets in certain embodiments.

The following description of the embodiments disclosed herein is not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that its usefulness is not limited thereto and that the embodiments of the present disclosure can be beneficially implemented in any number of environments for any number of purposes with or without any modifications.

As the number of transistors on a single integrated circuit (also referred to as a chip herein) has increased over few decades, the semiconductor industry has hit the limits of Moore's law. Additionally, placing too many transistors on the same chip generally results in higher costs as well as lower yields. Packaging technologies are being leveraged to increase system level integration by combining multiple dice in a single package. A system-in-package (alternatively system-in-a-package) can enable placement of multiple integrated circuits (ICs) with different functionalities in a single package that can perform as a system. Placement of multiple ICs in the same package can lower the overall cost by reducing the number of packages on a printed circuit board (PCB). Additionally their footprint on the PCB can be reduced which can provide a reduced system form factor. Furthermore, in most instances, reduced component count and interconnect length may result in reduced system power and improved performance. This can be beneficial in system designs that reply on low power, e.g., mobile devices. Multiple dice can be placed side by side or stacked vertically on top of each other using Through-Si-Vias (TSVs) in a single package using 2.5D or 3D integration. Some other technologies to integrate the ICs may include bridges, interposers, fan-out, or multi-chip modules (MCMs). Wire bonding or flip chip (FC) techniques may be used for interconnecting the ICs to the external circuits.

Generally, a system-in-package may use an organic substrate or laminate material similar to FR-4 for placement of multiple dice. In most instances, wire pitch of interconnect between the ICs on the substrate is relatively higher than the wire pitch on the silicon, e.g., by 10× or 20×. The wire pitch can be defined as the distance between two wires (alternatively traces or routes). Thus, the number of traces on the substrate may be relatively fewer, e.g., by 10× or as compared to the silicon. In certain systems, a silicon interposer may be used to provide connectivity between the dice in the same package. The connectivity may generally be provided using micro (µ) bumps. The interposer can provide fine pitch or high density traces on the silicon, however, the throughput of the interposer may be limited (e.g., 2 Gigabits per second (Gbps)/bump) with a reach of less than 5 mm/trace. Additionally, length of the interposer can proportionately increase the total cost of the package. Intel's Embedded Multi-die Interconnect Bridge© (EMIB) approach can provide a cost effective solution by using a localized high density interconnect silicon bridge for die-to-die interconnect using µ bumps. However, the throughput of the EMIB may also be limited (e.g., 2 Gbps/bump) with a reach of less than 3 mm/trace. In addition, EMIB is a proprietary technology only available to Intel®. In both the technologies, use of µ bumps for die-to-die interconnect can limit "good die" test coverage before packaging thus degrading package yield. Furthermore, timing closure and verification at the interface can be complex.

In certain instances, throughput between the ICs can be increased by using high speed interfaces thus increasing the data rate per connection. However, many systems utilize complex mixed signal technologies which cannot handle high speed interfaces. This may be generally true for memory chips which rely on slow memory transistors for low leakage. Thus, in order to implement a SiP using organic substrates, there is a need for an interconnect solution which can provide higher throughput over small number of wires without modifying the main chip interfaces.

Embodiments can provide systems and methods for SiP connectivity by connecting the main chips with ultra short reach (USR) chiplets using high density interconnect to provide high throughput for data transfer between the main chips. The main chips can include but are not limited to application specific integrated circuits (ASICs), processors, memory, graphics processor units (GPUs), or FPGAs. The high density interconnect can include vertical connections, micro bumps, or redistribution layer routes among others. The substrate or the main transmission medium in the package can be used to connect the main chips. In certain embodiments, a USR chiplet can be a small integrated circuit that can receive/transmit data at a lower data rate per connection for a higher number of connections and transmit/receive that data at a higher data rate per connection for a lower number of connections over ultra short distances (e.g., less than 100 mm). In this specification, terms "throughput", "data rate", "speed", or "bandwidth" can be used interchangeably as a measure of input/output (I/O) data transfer.

In certain embodiments, the USR chiplets can include the functionality of a serializer/deserializer (SerDes) to support higher speeds for communicating data streams over the substrate. The SerDes can include functional blocks to convert a parallel data stream into a serial stream of data for transmission on a high speed link. The ultra short connections between the main chip and the USR chiplets can reduce the parasitic resistor/inductor/capacitor (R/L/C) parameters, therefore help improve the dissipated power and connection speed compared to a regular 2.5D interposer or EMIB connection with a trace in between. In certain embodiments, data rate per connection between the USR chiplets can be increased by simultaneous bidirectional signaling to double bidirectional data rate per trace, converting binary data from main chips to multi-level pulse amplitude modulation (PAM) signaling, time multiplexing multiple parallel input bits into a single serial signal, or a combination thereof. The PAM signaling can provide a modulation technique for data transmission to maximize the I/O bandwidth.

FIG. 1 illustrates a cross-sectional view 100 of a system in package (SiP) comprising ultra short reach (USR) chiplets in certain embodiments.

Certain embodiments can provide solutions to build low cost 2.5D SiP products using embedded semiconductor in substrate (e.g., such as a SeSub) and USR chiplets for connectivity. The SiP may comprise a substrate 102 connected to solder balls 120 for connecting to external circuits. The substrate 102 can be an organic substrate, e.g., FR-4. USR chiplets can be used to provide high throughput for data transfer between a first chip 104 and a second chip 106. The first chip 104 may be a first main integrated circuit (IC) and the second chip 106 may be a second main IC. The first chip 104 or the second chip 106 can be a processor, memory, ASIC, FPGA, GPU, or another main chip. As an example, the first chip 104 may be a processor chip and the second chip 106 may be a memory chip. A USR chiplet 108 may be connected to the first chip 104 and a USR chiplet 110 may be connected to the second chip 106 to provide high throughput for data transfer between the first chip 104 and the second chip 106. In certain examples, throughput can be measured in gigabits per second (Gbps). The USR chiplet 108 and the USR chiplet 110 can be connected to the first chip 104 and the second chip 106 respectively using embedded silicon technology in the substrate 102.

Each USR chiplet can connect to the main chip through a high density interconnect to communicate the data stream with the main chip. Each main chip may include respective data interfaces comprising input/output (I/O) pads configured to carry data streams. Each USR chiplet may comprise a respective low throughput I/O data interface comprising I/O pads configured to communicate the data stream with the corresponding I/O pads of the main chip. For example, the USR chiplet 108 may comprise a low throughput I/O data interface comprising M×N I/O pads configured to communicate the data stream with corresponding M×N I/O pads of the first chip 104. M and N can be positive integers (having a value great than 1). Similarly, the USR chiplet 110 may comprise a low throughput I/O data interface comprising M×N I/O pads configured to communicate the data stream with corresponding M×N I/O pads of the second chip 106. Each respective M×N I/O pads may include bumps to connect to other components in the SiP. The bumps may include flip-chip (FC) bumps, micro (µ) bumps, or other suitable bumps. The first chip 104 and the second chip 106 may communicate with the external circuits or a system PCB (e.g., motherboard) connected to the solder balls 120 using vertical interconnect accesses (VIAs) 122.

In certain embodiments, the embedded USR chiplet 108 can be connected to the first chip 104 with ultra short connections by overlapping the bumps of the USR chiplet 108 with the corresponding bumps of the first chip 104 as shown by bumps 112a. Similarly, the embedded USR chiplet 110 can be connected to the second chip 106 with ultra short connections by overlapping the bumps of the USR chiplet 110 with the corresponding bumps of the second chip 106 as shown by bumps 112b. Overlapping the bumps can make the length of the wire connecting the bumps shorter which can reduce the capacitance thus lowering the power dissipation. The connections between the respective USR chiplet and the main chip can be a direct bump-to-bump without any trace in between. Therefore the substrate 102 may not need any metal routing layer for high throughput connections between the main chip and the USR chiplets. In one example, the bumps 112a and 112b may include the standard FC bumps with a pitch greater than 100 µm. In another example, for higher throughput requirement the bumps 112a and the bumps 112b may include the µ bumps with a pitch smaller than 50 µm.

Each USR chiplet may further comprise a high throughput I/O data interface to carry the data stream to higher throughput I/O pads. For example, the higher throughput I/O pads may include N I/O pads configured to operate at M times higher throughput than each of the M×N lower throughput I/O pads. Each USR chiplet may also comprise multiplexer/de-multiplexer circuits that can connect to the lower throughput I/O data interface on one side (e.g., the main IC) and to the higher throughput I/O data interface on another side (e.g., the other USR chiplet). The multiplexer/de-multiplexer circuits may be configured to multiplex at least a first portion of the data stream received from the main IC into a first portion of the data stream to be communicated with the other USR chiplet. The multiplexer/de-multiplexer circuits may also be configured to de-multiplex at least a second portion of the data stream received from the other USR chiplet into a second portion of the data stream to be communicated with the main IC.

The USR chiplet 108 and the USR chiplet 110 may communicate the data streams using the USR link 118 via their respective high throughput N I/O pads. The USR link 118 may include metal traces or electrical connections in the substrate 102. The USR chiplet 108 may be connected to the USR link 118 via bumps 116a at the respective N I/O pads. Similarly, the USR chiplet 110 may be connected to the USR link 118 via bumps 116b at the respective N I/O pads. The bumps 116a and 116b can be FC bumps with a pitch greater than 100 µm. In certain examples, the USR link 118 can provide 2×-20× throughput per connection over extended reach of 10×. As an example, compared to the 2 Gbps throughput of the existing technologies, the USR link 118 can provide up to 4 Gbps-40 Gbps throughput over extended reach of about 30 mm. Data rate per connection between the USR chiplets can be increased by simultaneous bidirectional signaling to double bidirectional data rate per connection, converting binary data from main chips to multi-level pulse amplitude modulation (PAM) signaling, time multiplexing multiple parallel input bits into a single serial signal at a higher data rate, or a combination thereof. The USR chiplet 108 and 110 may get powered through their respective power and ground bumps connected to the main chips or through direct power and ground connections to the main system. Interconnects 122 and 124 can provide direct connection of the main chips to the system PCB via the solder balls 120, e.g., using VIAs.

Thus, the SiP connectivity as discussed with reference to FIG. 1 can provide similar inter-die connectivity throughput to that of the silicon interposers with very few metal layers in the substrate. Higher inter-die connectivity reach of greater than 30 mm can be achieved in certain embodiments. Additionally, the cost of the substrate being significantly lower than the cost of the silicon interposer can result in overall reduction of the cost. Furthermore, embodiments can support direct connection of the main chips to the system PCB which can be important for analog/RF circuits.

Figure 2:
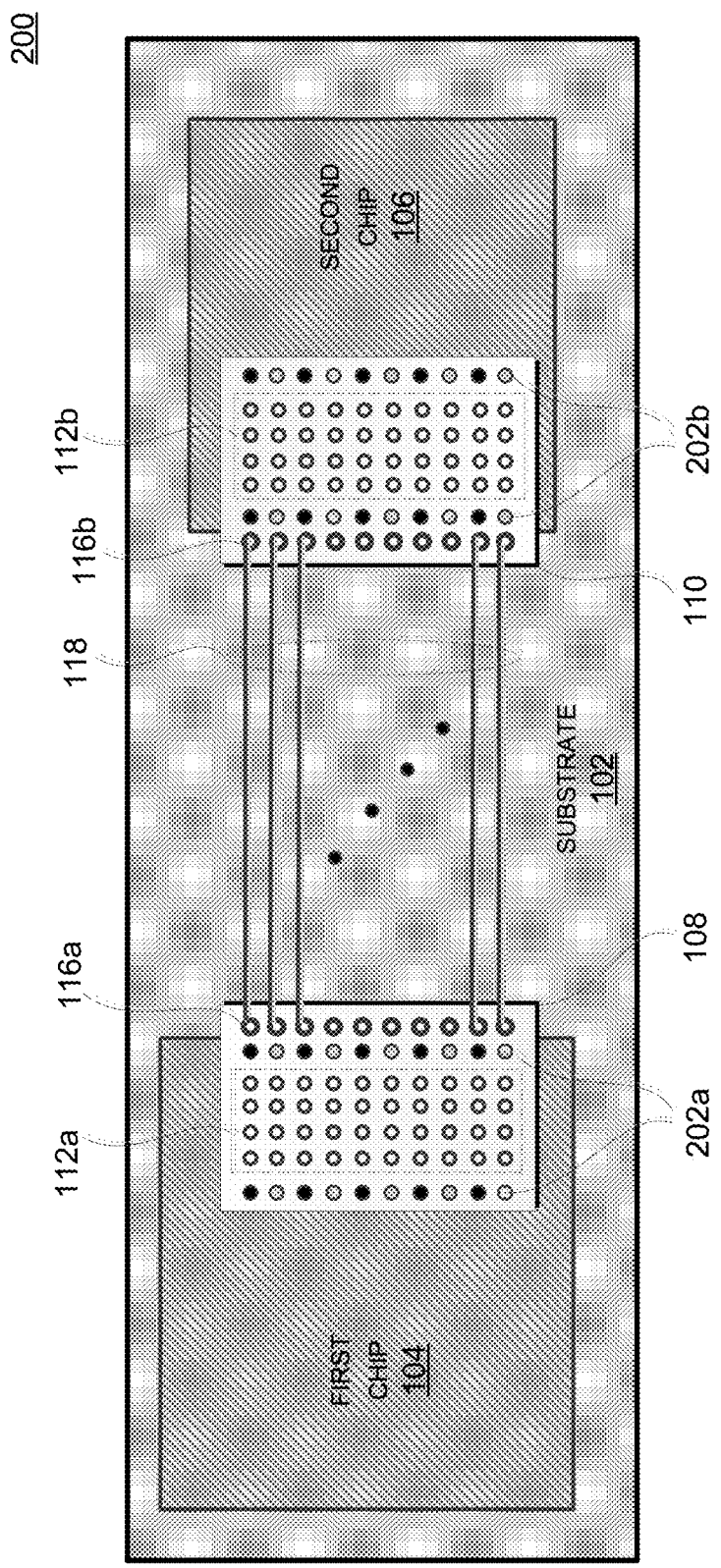
FIG. 2 illustrates a top level view of the SIP, in certain embodiments.

FIG. 2 illustrates a top level view 200 of the SiP discussed in FIG. 1, in certain embodiments.

A first set of bumps 202a may include power and ground bumps for the USR chiplet 108 that may be connected to the power and ground of the first chip 104. Similarly a second set of bumps 202b may include power and ground bumps for the USR chiplet 110 that may be connected to the power and ground of the second chip 106. In other examples, the first set of bumps 202a and the second set of bumps 202b may get powered through the power and ground connections to the main system.

As an example, M can be 4 and N can be 10. The bumps 112a may include (4×10=40) overlapping FC bumps connecting the first chip 104 with the USR chiplet 108 at the lower throughput M×N I/O pads. The bumps 116a may include (N=10) FC bumps connecting the USR chiplet 108 to the USR link 118 at the higher throughput N I/O pads. Similarly, the bumps 116b may include (N=10) FC bumps connecting the USR chiplet 110 to the USR link 118 at the higher throughput N I/O pads. The bumps 112b may include (4×10=40) overlapping FC bumps connecting the second chip 106 with the USR chiplet 110 at the lower throughput M×N I/O pads. The USR link 118 may include 10 traces over the substrate 102 connecting the first chip 104 and the second chip 106 through the USR chiplet 108 and the USR chiplet 110.

As an example, with the throughput of 4 Gbps/bump (or pad) for each of the overlapping FC bumps in the 40 bumps 112a and the 40 bumps 112b, throughput of up to 160 Gbps can be achieved between the first chip 104 and the second chip 108. The 10 FC bumps 116a or 116b connecting each of the USR chiplet 108 and 110 respectively to the substrate 102 can operate at 16 Gbps/bump. The USR chiplets 108 and 110 can allow a 4× reduction in the number of traces for the same throughput on either side. In another example, using the higher speed of 40 Gbps/bump for each of the overlapping FC bumps, the number of traces in the USR link 118 can be reduced by 10×. Thus, in certain embodiments, 2×-20× throughput and over extended reach of greater than 10× can be achieved on the USR link 118 as compared to EMIB, interposer, or other bridge solutions.

Certain embodiments can support the connection of the USR chiplets with the main chips that are embedded in the substrate. This is further discussed with the help of FIG. 3 and FIG. 4.

Figure 3:
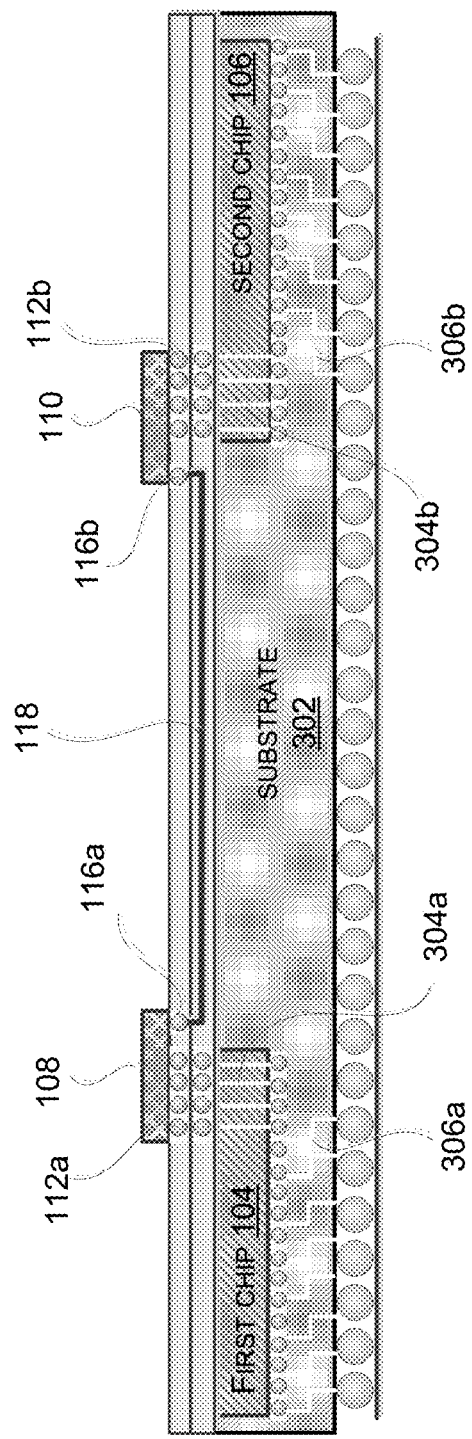
FIG. 3 illustrates a cross-sectional view of an SiP comprising embedded main chips connected to USR chiplets placed on top of a substrate, in certain embodiments.

FIG. 3 illustrates a cross-sectional view 300 of an SiP comprising embedded main chips connected to the USR chiplets placed on top of the substrate, in certain embodiments.

As shown in FIG. 3, the first chip 104 and the second chip 106 can be embedded in a substrate 302. The substrate 302 can be an organic substrate similar to the substrate 102. The USR chiplets 108 and 110 can be placed on top of the substrate 302. The USR chiplet 108 can be connected to the first chip 104 through a fine pitch interconnect, e.g., the overlapping bumps 112a including FC bumps or µ bumps. The first chip 104 can be connected to the overlapping bumps 112a using (through silicon via) TSVs 304a. Similarly, the second chip 106 can be connected to the overlapping bumps 112b using TSVs 304b. The bumps 116a and 116b can be FC bumps. The first chip 104 can connect to the system PCB using TSVs 306a and the second chip 106 can connect to the system PCB using TSVs 306b. Thus, certain embodiments can support alternative topologies for SiP connectivity with chip embedding without compromising on the throughput or the reach.

Figure 4:
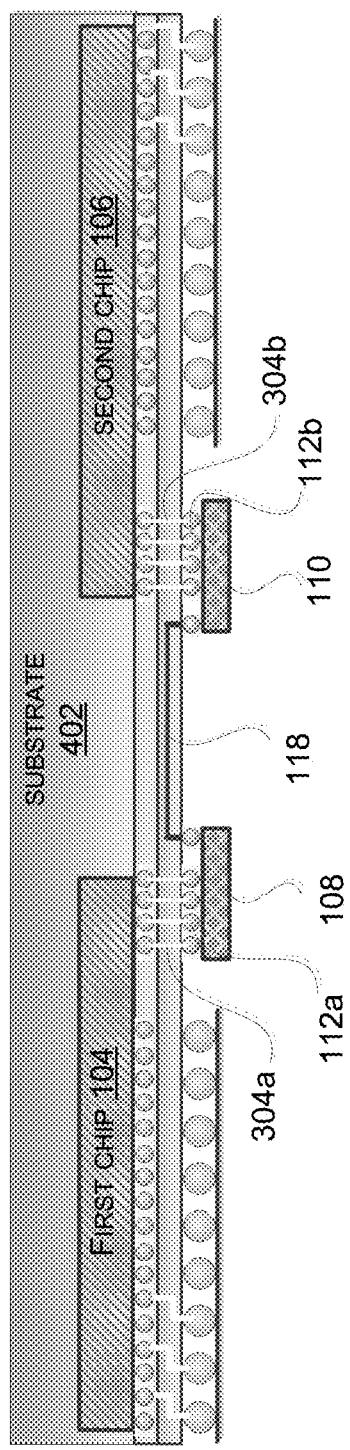
FIG. 4 illustrates a cross-sectional view of an SiP comprising embedded main chips connected to the USR chiplets placed on bottom of the substrate, in certain embodiments.

FIG. 4 illustrates a cross-sectional view 400 of an SiP comprising embedded main chips connected to the USR chiplets placed on bottom of the substrate, in certain embodiments.

As shown in FIG. 4, in certain embodiments, the USR chiplets 108 and 110 can be placed on the bottom of a substrate 402. The substrate 402 can be an organic substrate similar to the substrate 102. The first chip 104 can be connected to the overlapping bumps 112a using the TSVs 304a, and the second chip 106 can be connected to the overlapping bumps 112b using the TSVs 304b. Thus, irrespective of the placement of the USR chiplets on the substrate, higher throughput can be achieved over small number of wires in the USR link 118 without modifying the main chip interfaces. Certain embodiments can allow embedding the USR chiplets in the substrate without compromising on the throughput or the reach.

Figure 5:
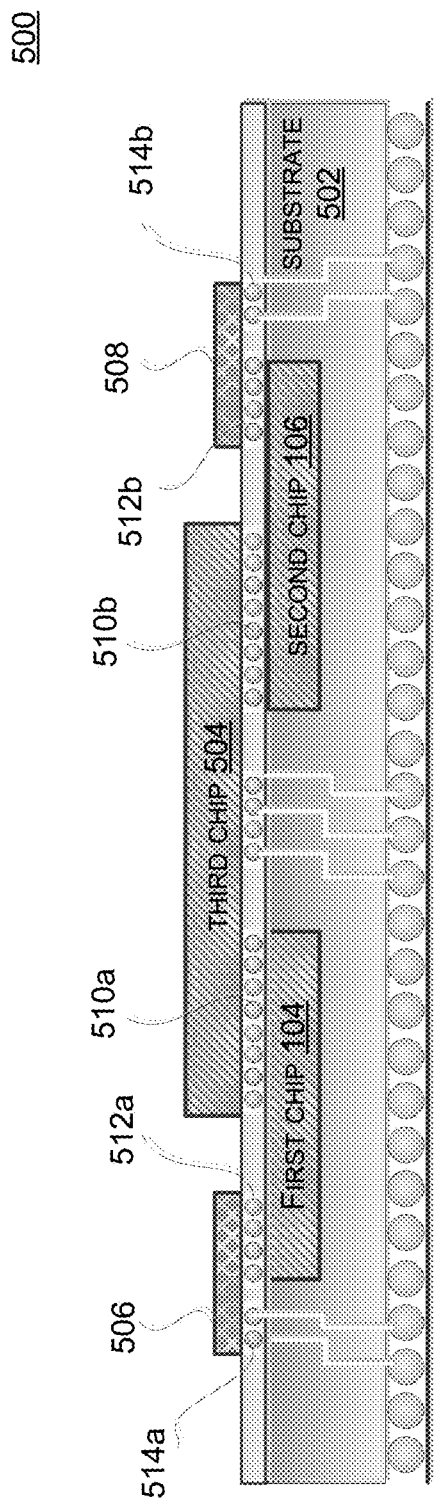
FIG. 5 illustrates a cross-sectional view of an SiP comprising a main chip placed on top of a substrate and other embedded main chips connected to physical layer (PHY) chiplets, such as serializer/deserializer (SerDes) chiplets, in certain embodiments.

FIG. 5 illustrates a cross-sectional view 500 of an SiP comprising a main chip placed on top of a substrate and other embedded main chips connected to physical layer (PHY) chiplets, such as SerDes chiplets, in certain embodiments.

As shown in FIG. 5, the first chip 104 and the second chip 106 can be embedded in a substrate 502. The substrate 502 can be an organic substrate similar to the substrate 102. A third chip 504 can be placed on top of the substrate 502 using bumps 510a and 510b. The bumps 510a and 510b can be FC bumps or µ bumps. The embedded chip 104 can face the third chip 504 and a SerDes chiplet 506 with overlapping bumps 510*a* and 512*a* respectively to have direct bump to bump connection. Similarly, the embedded chip 106 can face the third chip 504 and a SerDes chiplet 508 with overlapping bumps 510*b* and 512*b* respectively to have direct bump to bump connection. The bumps 512*a* and 512*b* can be FC bumps or µ bumps.

The topology discussed with reference to FIG. 5 can eliminate the need to have any silicon interface (e.g., interposer, EMIB, etc.) between the main chips. It can also provide high density connections without using several metal routing layers for higher trace density. Additionally, the SerDes functionality can be provided by connecting the SerDes chiplets 506 and 508 to the first chip 104 and the second chip 106 with overlapping bumps 512*a* and 512*b* respectively. The SerDes chiplets 506 and 508 can connect to the solder balls via FC bumps 514*a* and 514*b* respectively. In certain other embodiments, the third chip 504 can be placed on the bottom of the substrate 502 (not shown).

Figure 6:
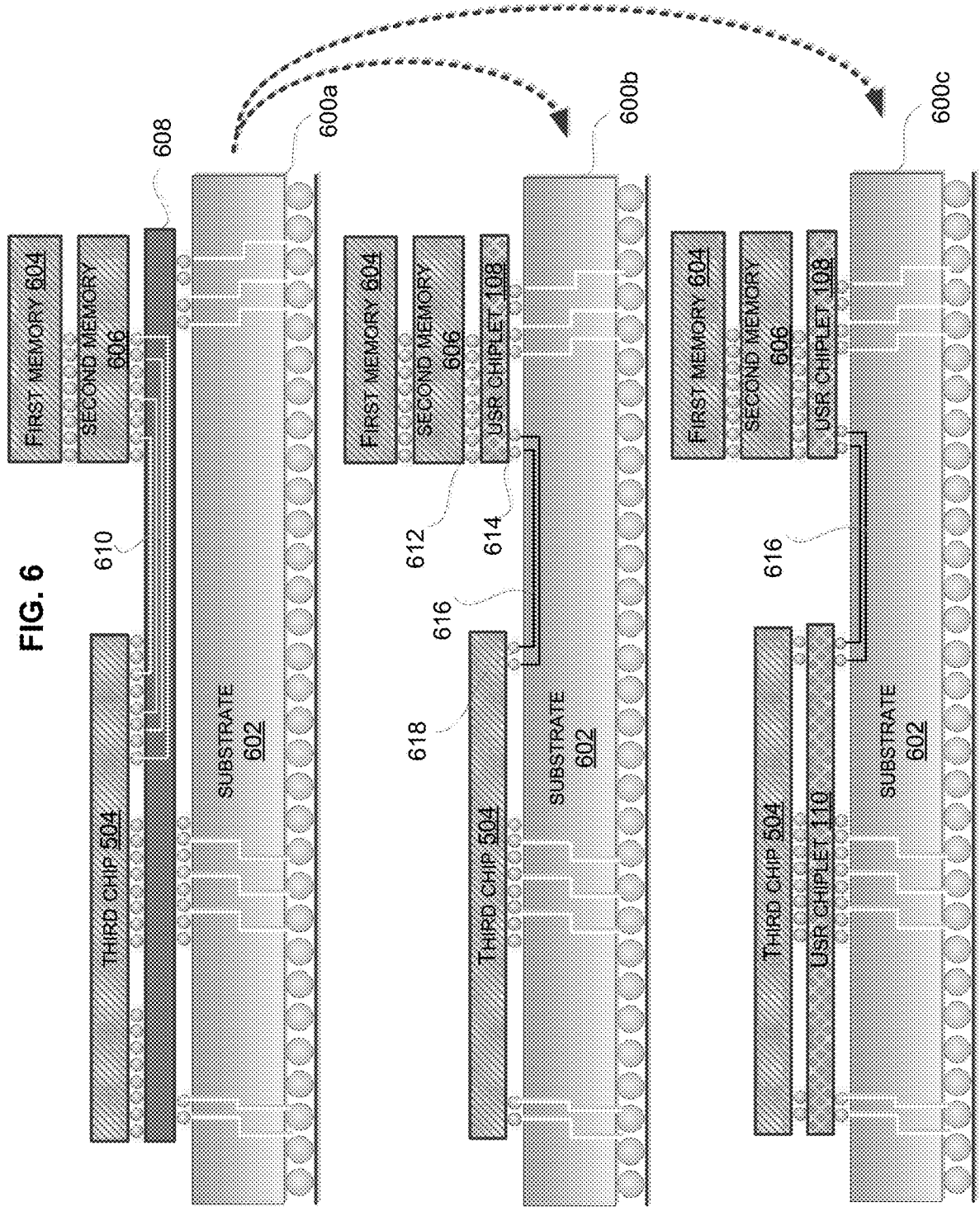
FIG. 6 illustrates example embodiments of an SiP comprising USR chiplets with or without a silicon interposer.

FIG. 6 illustrates example embodiments of an SiP comprising USR chiplets with or without a silicon interposer.

As shown in 600*a*, in certain implementations, an interposer 608 may be used to provide connectivity between the third chip 504 with a first memory 604 and a second memory 606 on a substrate 602. The substrate 602 may be similar to the substrate 102. The interposer 608 may provide wide low speed traces 610 between the third chip 504 and the memory chips 604 and 606. Here, the wide low speed traces may be equivalent to a high number of traces where each trace can handle low speed I/O data transfer, and the narrow high speed traces may be equivalent to a lower number of traces where each trace can handle high speed I/O data transfer. The interposer 608 generally provides a high cost solution because of the use of µ bumps for die-to-die connectivity and a large piece of silicon. Additionally the throughput provided by the interposer 608 may be limited. Embodiments can reduce the cost by reducing the number of traces and the silicon cost by replacing the interposer 608 with the USR chiplet 108 as shown in 600*b* and 600*c*. In certain embodiments, bi-directional signaling may be used simultaneously to increase the data rate.

The USR chiplet 108 can connect to the memory chips 604 and 606 having wide low speed I/O data interfaces using dense µ bumps 612. The USR chiplet 108 can be used to combine the wide low speed I/O data interface 612 into a narrow high speed I/O data interface 614 that can be used to communicate the data stream over fewer traces 616 on the substrate 602. Herein, wide low speed I/O data interfaces may include a high number of I/O data interfaces and narrow high speed I/O data interfaces may include a relatively lower number of I/O data interfaces, where each of the narrow high speed I/O data interface can operate at higher speed than each of the wide low speed I/O data interface. The narrow high speed I/O data interface 614 can include regular bumps (e.g., FC bumps) to connect to the third chip 504 via the traces 616. For example, in 600*b*, the third chip 504 may be capable to provide a high throughput I/O data interface 618 which can support communication of the data stream with the USR chiplet 108 over the traces 616. Use of regular bumps to connect with the third chip 504 in the embodiment shown in 600*b* can provide testability coverage for the memory stack before packaging with other chips, which may not be possible with µ bumps used in 600*a* for die-to-die connectivity using the interposer 608.

In certain instances, the third chip 504 may not be capable to provide a high throughput I/O data interface to connect to the USR chiplet 108. In such instances, the USR chiplet 110 may be used to provide the high throughput I/O data interface to communicate the data stream over the traces 616 as shown in 600*c*. The USR chiplet 110 may be connected to the third chip 504 using overlapped bumps. In certain other embodiments (not shown), the third chip 504 or the USR chiplet 110 can be embedded in the substrate 602 as discussed with reference to previous figures.

Figure 7:
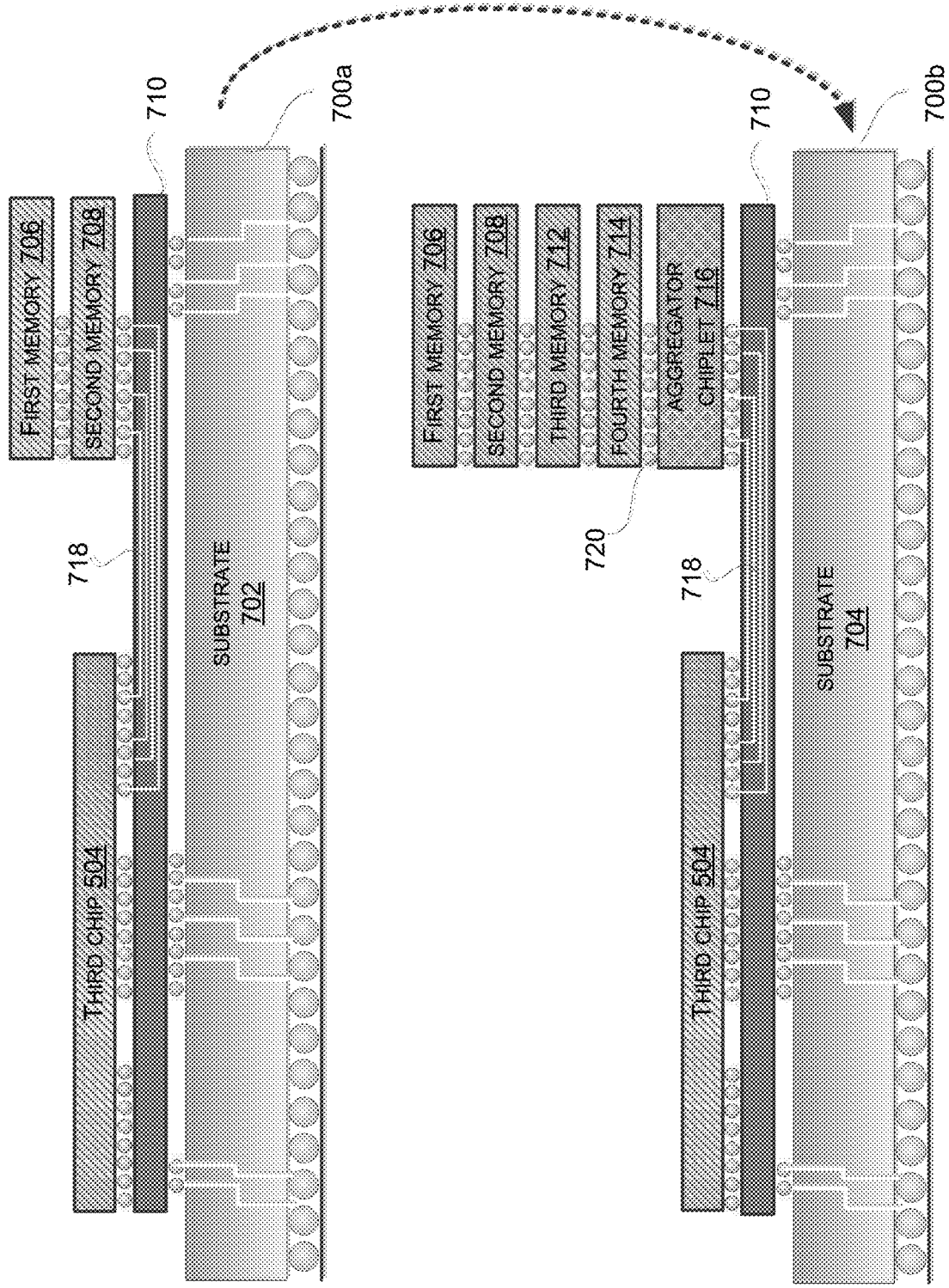
FIG. 7 illustrates an example embodiment to double the bandwidth over the same silicon interposer using an aggregator chiplet.

FIG. 7 illustrates an example embodiment to double the bandwidth over the same silicon interposer using an aggregator chiplet. The aggregator chiplet can be a USR chiplet.

Generally an interposer 710 may be used to provide connectivity between a first memory 706, and a second memory 708 with the third chip 504 as shown in 700*a*. The interposer 710 may be capable to provide die-to-die connectivity using low speed interposer traces 718. The substrate 702 may be similar to the substrate 102.

Certain embodiments can enable doubling the memory bandwidth over the interposer 710 using bidirectional signaling per interposer trace 718 using an aggregator chiplet 716. For example, as shown in 700*b*, a third memory 712 and a fourth memory 714 can be stacked on the aggregator chiplet 716 along with the first memory 706, and the second memory 708. The aggregator chiplet 716 can include functionality of the USR chiplet 108 or 110 as discussed with reference to previous figures. The aggregator chiplet 716 may be capable to transmit and receive signals from the stacked memory chips 706, 708, 712 and 714 using µ bumps 720. The aggregator chiplet 716 may be further capable to combine each transmit and receive signal into one wire on the interposer trace 718 (at the same baud rate as in 700*a*) using a bidirectional signaling transceiver. The third chip 504 can include a compatible bidirectional transceiver to support the bidirectional signaling over the interposer traces 718. Alternatively, the third chip 504 can be placed on top of another aggregator chiplet (not shown) comprising the bidirectional transceiver to communicate the data stream over the interposer traces 718 using bidirectional signaling. Thus, the use of aggregator chiplet 716 can allow doubling the memory stack data transfer bandwidth with the third chip 504 at the same baud rate for the same interposer 710 and the number of traces 718. Simultaneous bidirectional signaling can enable doubling the effective throughput per trace on the silicon interposer 710 which may not be otherwise possible by increasing signaling baud rate on the interposer traces 718 due to signal integrity limitations such as crosstalk between the traces.

Certain embodiments may utilize a second approach to connect the main chip with the USR chiplets using re-distribution layers (RDL) in place of overlapping bumps as discussed with reference to FIG. 1. The RDLs can electrically connect different parts of the package using metal traces. In certain embodiments, integrated multi-die fan-out (IMFO) wafer level packaging can be used to provide a high throughput for communicating data streams between the main chips over small number of wires. IMFO packaging can integrate multiple dice together in a mold material and connect them with metal traces on the post process RDLs. This is further explained with reference to FIG. 8, FIG. 9 and FIG. 10.

Figure 8:
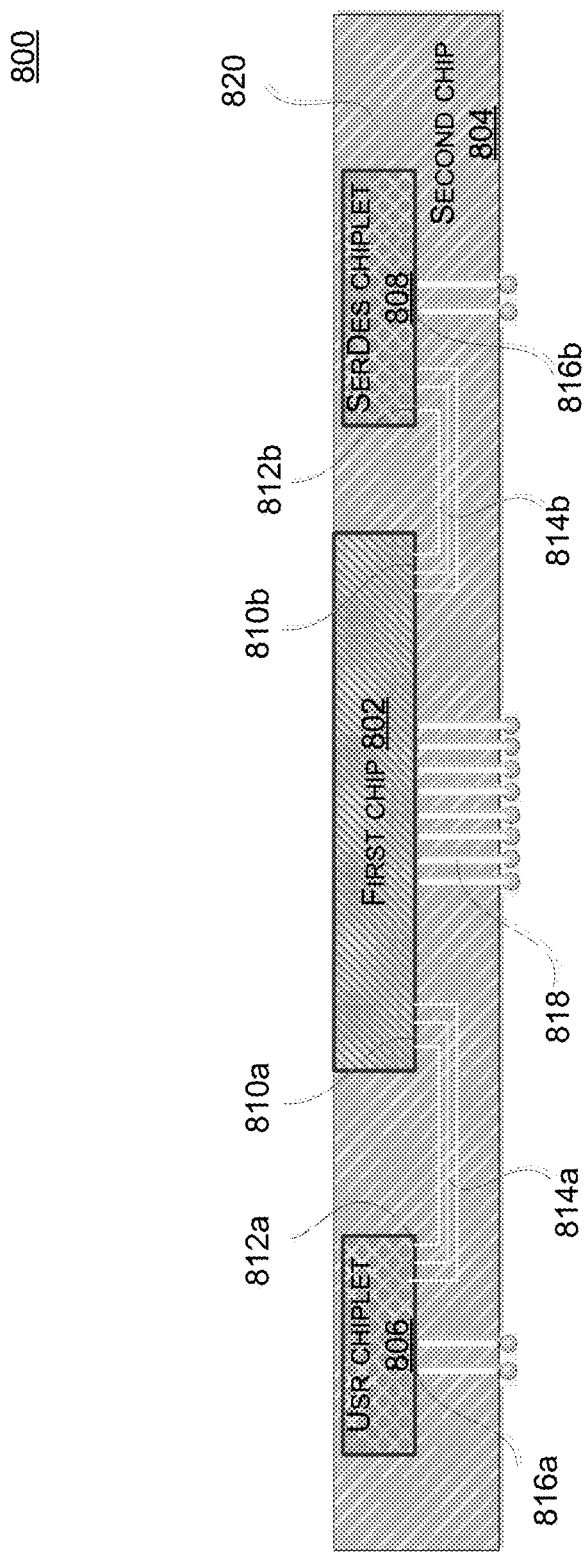
FIG. 8 illustrates a cross-sectional view of a wafer-level integrated multi-die using re-distribution routing layers to connect the embedded chiplets to the main chip, in certain embodiments.

FIG. 8 illustrates a cross-sectional view of a wafer-level integrated multi-die system 800 using re-distribution routing layers to connect the embedded chiplets to the main chip, in certain embodiments.

A first chip 802 may include high density low speed I/O inter-die interfaces 810*a* and 810*b*. The first chip 802 can be a processor, memory, ASIC, FPGA or another main chip. For examples, the interfaces 810*a* and 810*b* may include a high bandwidth memory (HBM) interface, advanced interface bus (AIB), or another low speed high wire count interface. Herein, the high density interface may be equivalent to a high wire count (wide) interface, and the low density interface may be equivalent to a low wire count (narrow) interface. The interfaces 810a and 810b may comprise internal I/O pads with a pitch greater than 100 μm, or a fine pitch less than 50 μm for high density or wire count interfaces. Certain embodiments can enable the first chip 802 to provide a high speed I/O interface to other main chips by connecting the first chip 802 with a USR chiplet 806 using their respective low speed I/O interfaces. For example, the USR chiplet 806 may include a high density low speed I/O interface 812a and a low density high speed I/O interface 816a. Similarly, a SerDes chiplet 808 may include a high density low speed I/O interface 812b and a low density high speed I/O interface 816b.

In certain embodiments, the USR chiplet 806 can use the high density low speed I/O interface 812a to connect to the high density low speed I/O inter-die interface 810a of the first chip 802 over inter-chiplet traces 814a on a redistribution layer 820. Similarly the SerDes chiplet 808 can use the high density low speed I/O interface 812b to connect to the high density low speed I/O inter-die interface 810b of the first chip 802 over inter-chiplet traces 814b on the redistribution layer 820. The low density high speed I/O interfaces 816a and 816b may be capable to support same total throughput as the total throughput over the high density low speed I/O inter-chiplet traces 814a and 814b.

In certain embodiments, the first chip 802, the USR chiplet 806 and the SerDes chiplet 808 can be integrated together in a mold material using IMFO packaging. The final IMFO package may result in a second chip 804 comprising the functionality of the first chip 802 with the low density high speed I/O interface 816a and 816b of the USR chiplet 806 and the SerDes chiplet 808. In certain implementations, the interfaces 816a and 816b can comprise I/O pads including FC bumps with a pitch greater than 100 μm. The IMFO packaging can provide a low cost solution to integrate multiple dice to produce the second chip 804 which can be integrated with other chips on a low cost organic substrate and provide high bandwidth connectivity to other chips on the low cost substrate using the interfaces 816a and 816b. The first chip 802 can also have a separate interface 818 to connect to other chips on the substrate. This is explained with reference to FIG. 9.

Figure 9:
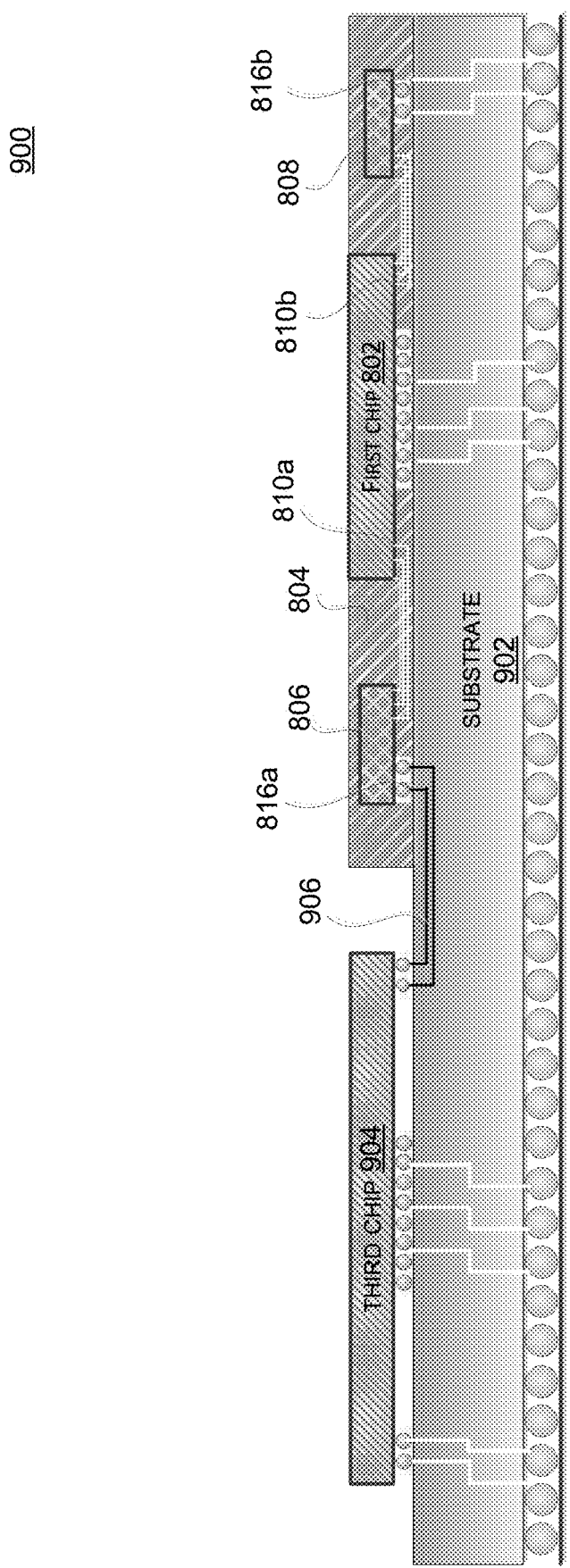
FIG. 9 illustrates a cross sectional view of a wafer-level integrated multi-die comprising an integrated multi-die fan-out (IMFO) packaged integrated circuit in certain embodiments.

FIG. 9 illustrates a cross sectional view of a wafer-level integrated multi-die 900 comprising an IMFO packaged IC in certain embodiments.

As shown in FIG. 9, the second chip 804 can be connected to a third chip 904 on an organic substrate 902 using an interface 906. The third chip 904 can be a processor, memory, ASIC, FPGA, or another main chip. The interface 906 can include high speed traces between the USR chiplet 806 and the third chip 904 which can support a higher data rate per trace as compared to the interfaces 814a or 814b in FIG. 8.

In certain examples, the first chip 802 can be taped out once with the low speed high pad count interfaces (e.g., 810a and 810b) and the second chip 804 can be produced by integrating the first chip 802 with the complex USR chiplet 806 and the SerDes chiplet 808 at low cost using the IMFO packaging.

Figure 10:
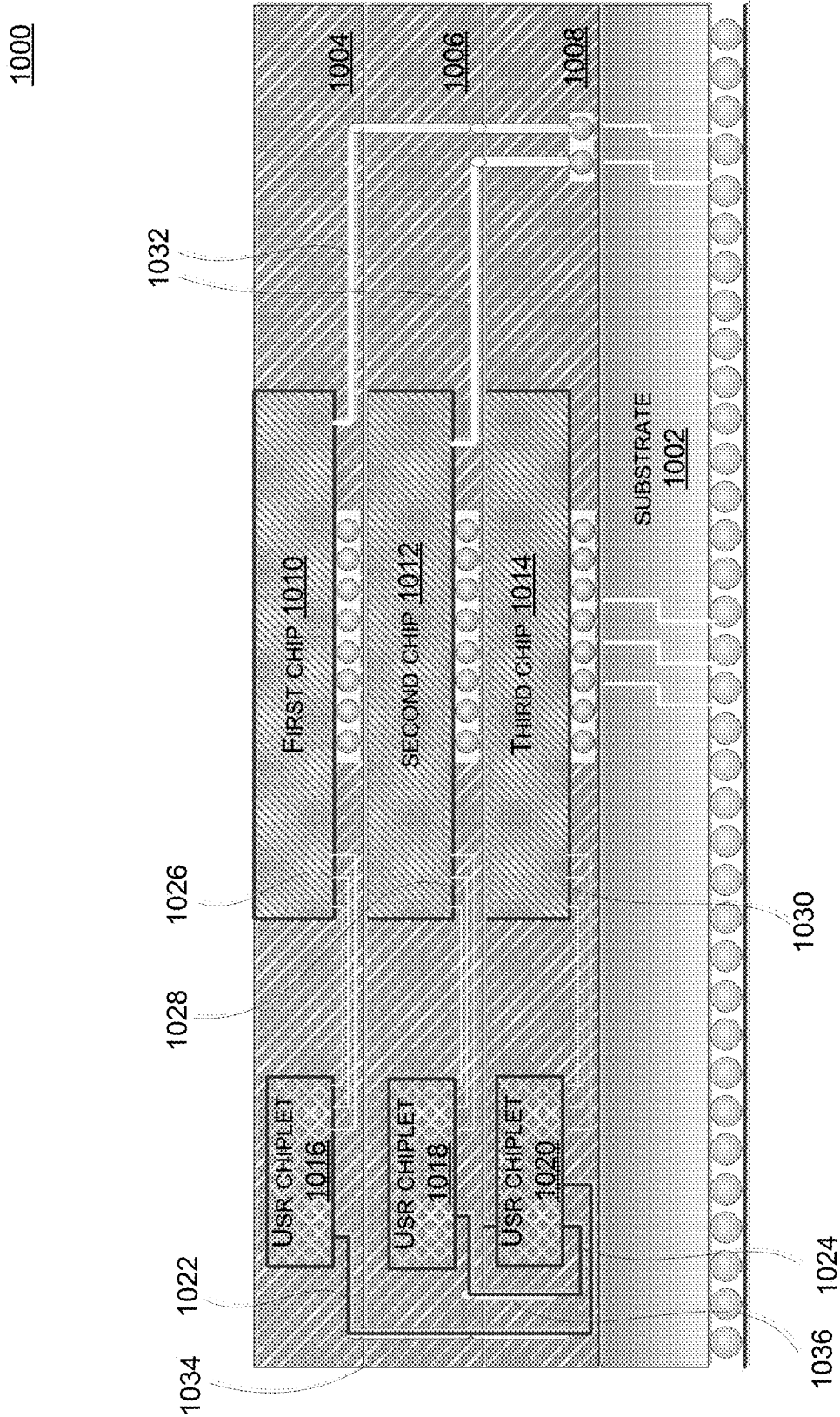
FIG. 10 illustrates a cross sectional view of a wafer-level integrated multi-die with 3D stacking of main chips using IMFO in certain embodiments.

FIG. 10 illustrates a cross sectional view of a multi-die integrated system 1000 with 3D stacking of main chips using IMFO in certain embodiments.

As illustrated in FIG. 10, IMFO chips 1004, 1006, and 1008 may be 3D stacked on a substrate 1002. The substrate 1002 may be an organic substrate similar to the substrate 102. The IMFO chips 1004, 1006, and 1008 may be produced using IMFO packaging similar to the second chip 804 discussed with reference to FIG. 8. The IMFO chip 1004 can comprise a first chip 1010 connected to a USR chiplet 1016. As an example the first chip 1010 can be a memory chip connected to the USR chiplet 1016 using a high density low speed I/O interface 1026 based on HBM. Similarly, the IMFO chip 1006 can comprise a second chip 1012 connected to a USR chiplet 1018. The second chip 1010 can be another memory chip connected to the USR chiplet 1018 using another high density low speed I/O interface 1028 based on HBM. Additionally, the IMFO chip 1008 can comprise a third chip 1014 connected to a USR chiplet 1020. The third chip 1014 can be a CPU, a GPU, or another processor connected to the USR chiplet 1020 using a high density low speed I/O interface 1030 based on MB. The USR chiplets 1016, 1018, and 1020 can be similar to the USR chiplets 108 or 110 as discussed with reference to FIG. 1.

Generally, the inter-stack vias in IMFO chips have a larger pitch than RDL routes in the IMFO chips, typically greater than 100 μm. Therefore achieving high bandwidth between the stacks may not be practical with low speed I/O interfaces such as HBM or MB. Certain embodiments can provide a low cost solution using IMFO chips with integrated USR chiplets to implement 3D stacking with high bandwidth connectivity between the stacked chips as shown in FIG. 10.

The USR chiplet 1020 can connect to the USR chiplet 1016 using an interface 1022 and to the USR chiplet 1018 using an interface 1024. The interfaces 1022 and 1024 may include high speed traces over IMFO stacked vias or through mold vias (TMVs) 1034 and 1036 respectively. Each of the USR chiplet 1016, 1018, 1020 can multiplex every M signal from the low speed parallel interfaces 1026, 1028, or 1030 into high speed traces 1022 and 1024 which can provide M times the data rate of the interfaces 1026, 1028 or 1030. One or more interfaces 1032 may be used for power or ground connections or for other connections to the substrate 1002.

Thus, certain embodiments can utilize IMFO integration with the USR chiplets to provide a low cost method to add low density high speed USR interface to a chip with basic high density low speed parallel interfaces. This can also provide a low cost solution as compared to using silicon interposers by enabling connectivity to other chips or chiplets over the organic substrates. Additionally, the USR chiplet output interfaces can support regular bumps in place of μ bumps which can enable production screening for "known good-die" by automated test equipment (ATE) machines. The embodiments can also allow direct connection of the main chips to the system PCB for analog/RF circuits, which is generally not possible with the use of an interposer. Certain embodiments can also enable a low cost 3D packaging to provide high bandwidth connectivity between stacked IMFO chips by eliminating the need for fine pitch and expensive TSVs. Additionally, in certain embodiments, higher inter-die connectivity reach of greater than 30 mm can be achieved using the USR chiplets.

Figure 11:
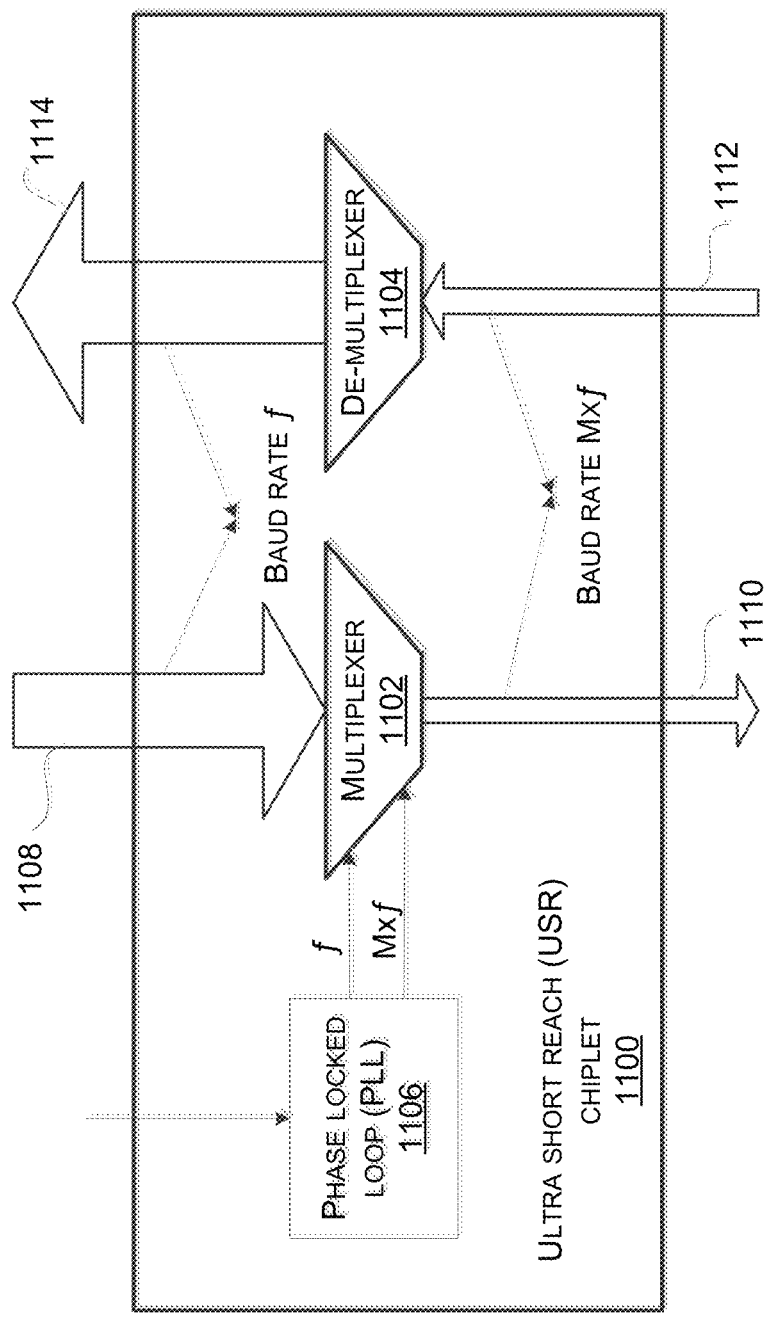
FIG. 11 illustrates an example block diagram for a USR chiplet in certain embodiments.

FIG. 11 illustrates an example block diagram for a USR chiplet 1100 in certain embodiments. The USR chiplet 1100 can be similar to any of the USR chiplets discussed with reference to FIGS. 1-10. The USR chiplet 1100 can be implemented using any suitable integrated circuit. Note that the USR chiplet 1100 can include different or additional components or functionality, which are not shown here for the ease of simplicity.

In certain implementations, the USR chiplet 1100 can include a multiplexer 1102, a de-multiplexer 1104, and a phase locked loop (PLL) 1106. The PLL 1106 can be used to provide a range of frequencies between f and M×f to support different data rates handled by the USR chiplet 1100. For example, the PLL 1106 can include logic to convert bits from parallel data streams into serial data bits by alternating them on an up or down parts of the signals. M can include an integer value greater than 1. Any suitable implementation of the PLL 1106 can be used.

The multiplexer 1102 and the de-multiplexer 1104 may include circuits that connect to a main chip on one side and to a substrate on another side using respective interfaces. As an example, the multiplexer 1102 may be connected to the main chip on one side (e.g., input side) using a wide low speed I/O data interface 1108 and to the substrate on another side (e.g., output side) using a narrow high speed I/O data interface 1110. Similarly, the de-multiplexer 1104 may be connected to the substrate on one side (e.g., input side) using a narrow high speed I/O data interface 1112 and to the main chip on another side (e.g., output side) using a wide low speed I/O data interface 1114. The wide low speed I/O data interface 1108, narrow high speed I/O data interface 1110, wide low speed I/O data interface 1114, or the narrow high speed I/O data interface 1112 may include bumps, pads, links, wires, metal traces, or other suitable interconnect. In various embodiments, the interfaces 1108 and 1114 may be connected to the main chip over the substrate using direct via-via connections, or over the RDL using metal routings. Similarly, the interfaces 1110 and 1112 may be connected to the substrate using bumps or metal traces.

Referring back to FIG. 1, the multiplexer 1102 in the USR chiplet 108 may be connected to the first chip 104 on one side using the wide low speed I/O data interface 1108. The multiplexer 1102 may receive a first data stream comprising M×N bits from the first chip 104 at a baud rate of f via the wide low speed I/O data interface 1108 using the overlapping pads 112*a*. In this example, the wide low speed I/O data interface 1108 may include FC bumps, µ bumps, or other suitable link to provide direct via-via connections with the first chip 104. The multiplexer 1102 may be configured to multiplex at least a first portion (e.g., M×N1 data bits) of the first data stream into a first potion (e.g., N1 data bits) of a second data stream. The second data stream may be carried by the N I/O pads 116*a* configured to operate at M times higher data rate per I/O than each of the M×N I/O pads 112*a*. The second data stream may be communicated at a baud rate of M×f via the narrow high speed I/O data interface 1110 to the substrate 102. In this example, the narrow high speed I/O data interface 1110 may include FC bumps or other suitable link to connect with the substrate 102. The second data stream may be transmitted at the high data rate per I/O via the USR link 118 to the USR chiplet 110.

In certain embodiments, the USR chiplet 1100 may include the circuits to perform multi-level pulse-amplitude-modulation (PAM-N) to encode the binary data stream into the amplitude of a series of signal pulses to increase the data rate per trace. In certain other embodiments, the data rate may be increased by time multiplexing parallel inputs bits to a single serial signal.

The de-multiplexer 1104 in the USR chiplet 110 may receive the data at the baud rate of M×f via the narrow high speed I/O data interface 1112 using the pads 116*b* connected to the substrate 102. The de-multiplexer 1104 may be configured to de-multiplex at least a second portion of the second data stream (e.g., N2 data bits) into a second portion (e.g., M×N2 data bits) of the first data stream. The N1 plus N2 equal to N. The de-multiplexer 1104 may provide the first data stream at the baud rate of f via the wide low speed I/O data interface 1114 to the second chip 106 using the pads 112*b*. In this example, the wide low speed I/O data interface 1114 may include FC bumps, µ bumps, or other suitable link to provide direct via-via connections with the second chip 106. In one example, N1 and N2 may correspond to a full portion (e.g., N) of the respective data stream. For example, the USR chiplet 108 may use the multiplexer 1102 to produce the N data bits operating at the baud rate of M×f and the USR chiplet 110 may use the de-multiplexer 1104 to produce the M×N data bits operating at the baud rate of M×f. In another example, the USR chiplet 110 may use the multiplexer 1102 to produce the N data bits operating at the baud rate of M×f and the USR chiplet 108 may use the de-multiplexer 1104 to produce the M×N data bits operating at the baud rate of M×f.

Referring back to back to FIG. 9, the multiplexer 1102 in the USR chiplet 806 may be connected to the first chip 802 on one side using the wide low speed I/O data interface 1108. The multiplexer 1102 may receive a first data stream comprising M×N bits from the first chip 802 at a baud rate of f via the wide low speed I/O data interface 1108 over the inter-chiplet traces 814*a* on the redistribution layer 820. The multiplexer 1102 may be configured to multiplex at least a first portion (e.g., M×N1 data bits) of the first data stream into a first potion (e.g., N1 data bits) of a second data stream. The second data stream may be carried by the N I/O pads configured to operate at M times higher data rate than each of the M×N I/O pads. The second data stream may be communicated at a baud rate of M×f via the narrow high speed I/O data interface 1110 to the substrate 902. In this example, the narrow high speed I/O data interface 1110 may include FC bumps or other suitable link to connect with the substrate 902. The second data stream may be transmitted at the high data rate via the interface 906 to the third chip 904 which may be capable to support high speed interfaces.

Certain embodiments can support simultaneous bidirectional signaling to double the bidirectional data rate per trace as discussed with reference to FIG. 12.

Figure 12:
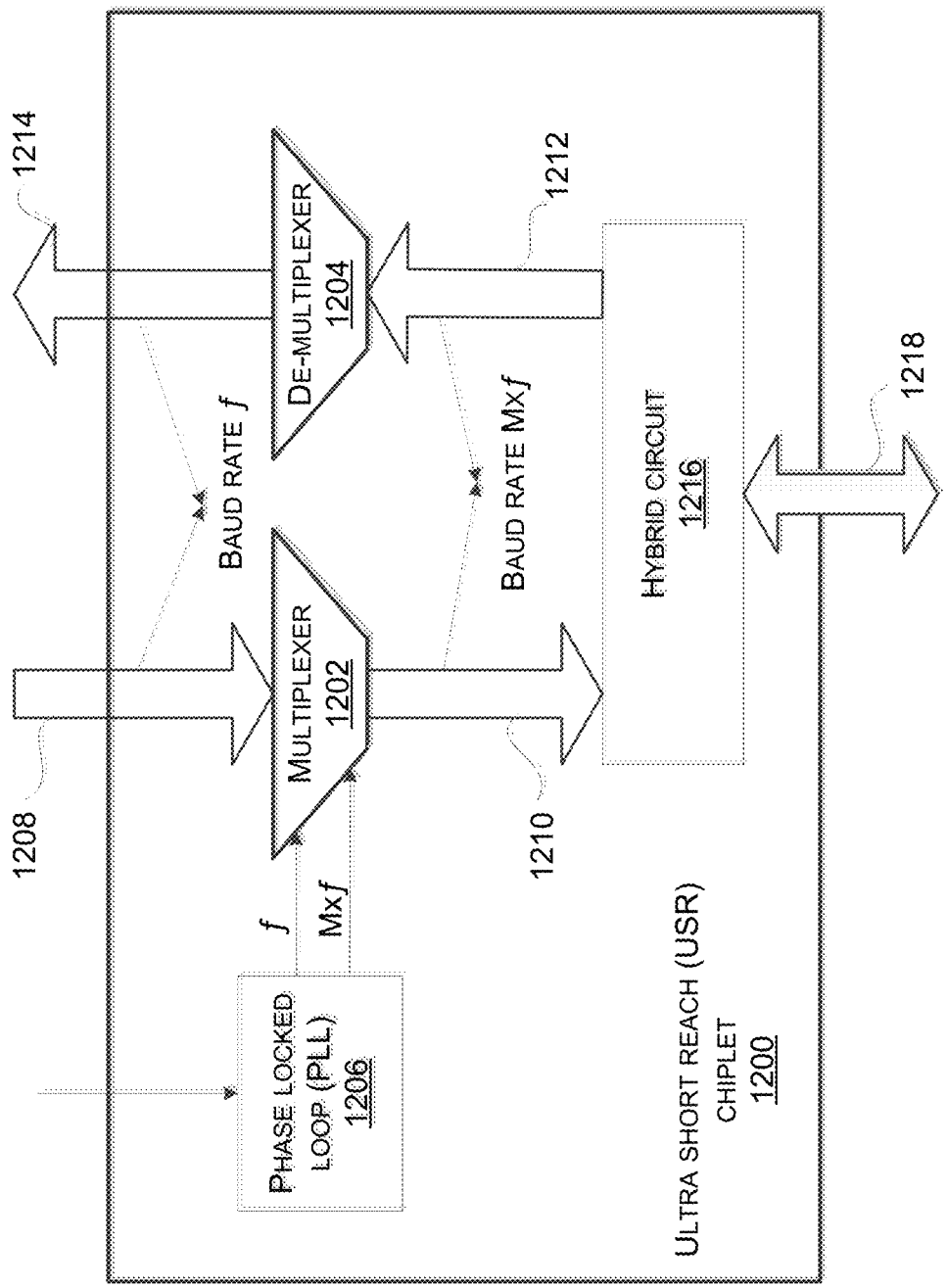
FIG. 12 illustrates an example block diagram for a bidirectional USR chiplet in certain embodiments.

FIG. 12 illustrates an example block diagram for a bidirectional USR chiplet 1200 in certain embodiments. As illustrated in FIG. 12, the bidirectional USR chiplet 1200 may include a hybrid circuit 1216, in addition to a PLL 1206, a multiplexer 1202 and a de-multiplexer 1204 similar to the PLL 1106, multiplexer 1102, and the de-multiplexer 1104 discussed with reference to FIG. 11. The multiplexer 1202 may include a mux input data interface 1208 and a mux output data interface 1210. Similarly, the de-multiplexer 1204 may include a de-mux input data interface 1212 and a de-mux output data interface 1214. The hybrid circuit 1216 may include circuits to couple a bidirectional interface 1218 to the mux output data interface 1210 of the multiplexer 1202 and the de-mux input data interface 1212 of the de-multiplexer 1204. The hybrid circuit 1216 can be designed to extract the received signal from the bidirectional interface 1218 to couple to the de-mux input data interface 1212 and receive the signal from the mux output data interface 1210 to couple to the bidirectional interface 1218. As an example, the hybrid circuit 1216 may include a transceiver or another suitable implementation to perform bidirectional signaling.

The multiplexer 1202 can multiplex M×N1 data bits received at the baud rate of f via the mux input data interface 1208 from the main chip into N1 data bits for transmitting at the baud rate of M×f via the mux output data interface 1210 to the hybrid circuit 1216, where M is a positive integer equal or greater than unity. Simultaneously, the de-multiplexer 1204 can de-multiplex the N2 data bits received at the baud rate of M×f via the de-mux input data interface 1212 from the hybrid circuit 1216 into M×N2 data bits for transmitting at the baud rate of f via the de-mux output data interface 1214 to the main chip.

Referring back to FIG. 7, in certain embodiments, the bidirectional USR chiplet 1200 can be used in place of the aggregator chiplet 716 to transmit and receive signals simultaneously from the stacked memory chips 706, 708, 712 and 714 to double the memory bandwidth over the interposer 710.

Figure 13:
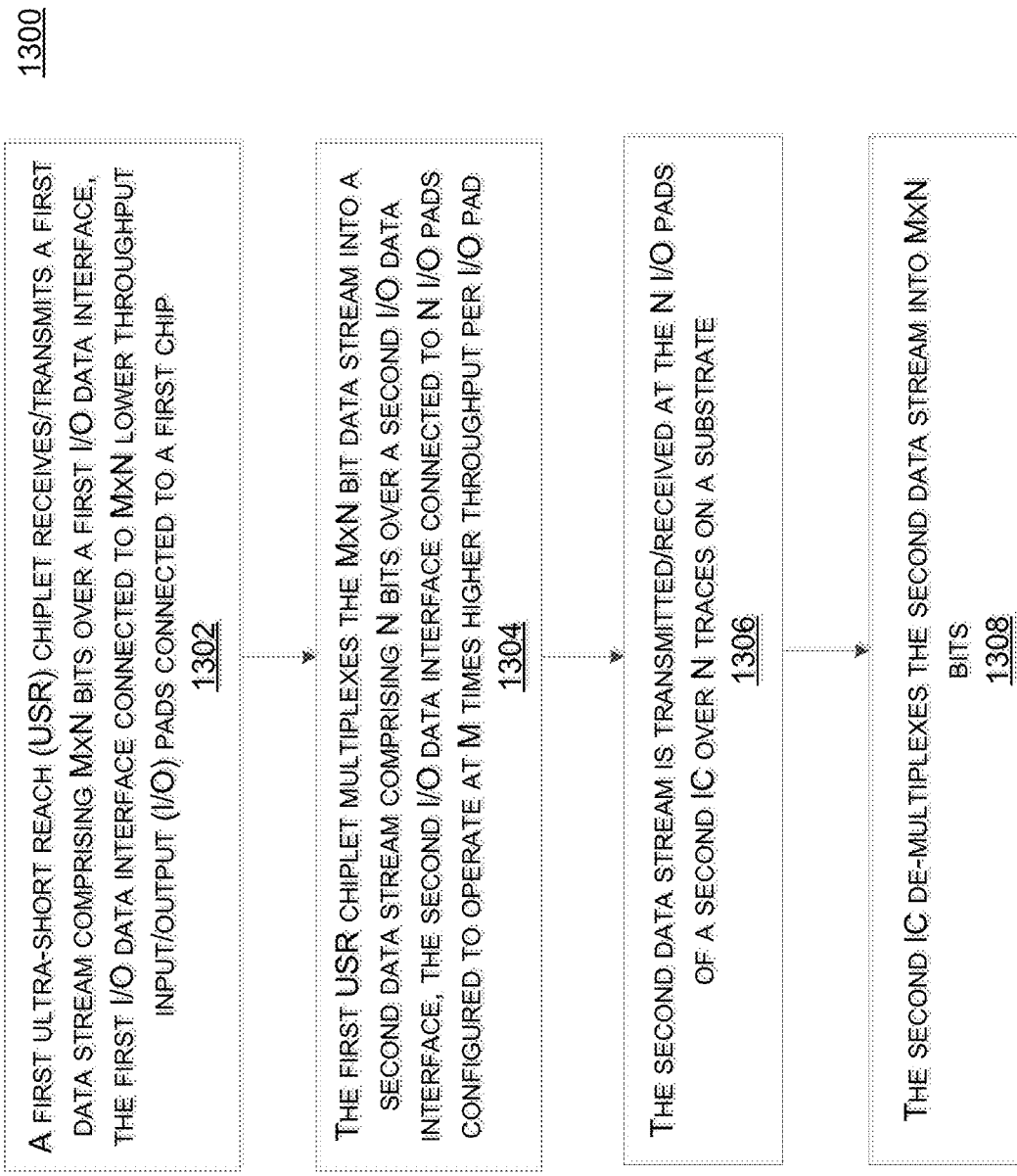
FIG. 13 illustrates a method executed by an SiP comprising a USR chiplet to provide a high throughput connectivity between the main chips using a small number of substrate traces according to certain embodiments.

FIG. 13 illustrates a method 1300 executed by an SiP comprising a USR chiplet to provide a high throughput connectivity between the main chips using a small number of substrate traces according to certain embodiments.

In step 1302, a first USR chiplet may receive/transmit a first data stream comprising M×N bits over a first I/O data interface. The first I/O data interface may be connected to M×N lower throughput I/O pads connected to a first chip. As an example, the method 1300 may be executed by an SiP package comprising the substrate 102 as discussed with reference to FIG. 1. In one example, the USR chiplet 108 may receive a first data stream comprising M×N bits from the first chip 104 over an I/O data interface comprising the I/O pads including the bumps 112a connected to the first chip 104. The first chip 104 may be a memory chip. The I/O pads including the bumps 112a may be lower throughput I/O pads. Referring back to FIG. 11, the multiplexer 1102 in the USR chiplet 108 may receive the first data stream comprising the M×N bits from the first chip 104 over the first I/O data interface (e.g., the wide low speed I/O data interface 1108) operating at the baud rate of f.

In step 1304, the first USR chiplet may multiplex the M×N bit data stream into a second data stream comprising N bits over a second I/O data interface. The second I/O data interface may be connected to N I/O pads configured to operate at M times higher throughput per I/O pad. Referring back to FIG. 11, the multiplexer 1102 in the USR chiplet 108 may multiplex the M×N bit data stream into a second data stream comprising N bits. The second I/O data interface connected to the N I/O pads may be the narrow high speed I/O data interface 1110 operating at M times higher throughput per I/O. The N I/O pads may be operating at M times higher throughput using M×f baud rate, bidirectional signaling, or PAM-N signaling.

In step 1306, the second data stream may be transmitted/received at the N I/O pads of a second IC over N traces on a substrate. Referring back to FIG. 1, in a first example, the second IC can be the USR chiplet 110 and the second data stream may be transmitted from the pads 116a of the USR chiplet 108 to the pads 116b of the USR chiplet 110 over the USR link 118 on the substrate 102. In a second example, the second chip can be a CPU with a high speed data interface. Referring back to FIG. 6, the second data stream may be transmitted from the pads 614 of the USR chiplet 108 to the third chip 504 over the USR link 616 on the substrate 602.

In step 1308, the second IC may de-multiplex the second data stream into M×N bits. In the first example, referring back to FIG. 11, the de-multiplexer 1104 in the USR chiplet 110 may receive the second data stream over the narrow high speed I/O data interface 1112 using the pads 116b connected to the substrate 102. The de-multiplexer 1104 may de-multiplex the N bit data stream into M×N lower throughput I/O pads 112b connected to the second chip 106 using the wide low speed I/O data interface 1114. In the second example, referring back to FIG. 6, the third chip 504 may be designed to de-multiplex the N bit data stream received from the USR chiplet 108 into M×N bit data stream for internal use.

Thus, the number of connections or traces between the main ICs on a substrate can be reduced by converting the M×N wide low speed I/O data interfaces of the main IC by a factor M into N high speed I/O data interfaces using the USR chiplets. In certain examples, instead of a second USR chiplet, a main chip (e.g., a CPU) with a high speed I/O data interface can receive N bit data stream from a first USR chiplet to reduce the number of traces on a substrate. The main chip can separate the N bit high speed data stream into M×N bits low speed data stream for internal use.

It will be understood that the claimed invention is not limited to the particular embodiments discussed in this specification and variations of the embodiments described above are possible without departing from the scope of the disclosure.

What is claimed is:

1. A system in a package, comprising:
    a first integrated circuit (IC) chip comprising:
        a first data interface comprising a first set of M×N input/output (I/O) pads of a first pad pitch, wherein M and N are positive integers, the first data interface configured to transfer first data in a first data stream; and
    an ultra short reach (USR) IC chip coupled to the first IC chip via multiple parallel links, the USR IC chip comprising:
        a second data interface comprising a second set of M×N I/O pads, the second set of M×N I/O pads coupled to the first set of M×N I/O pads through the multiple parallel links to communicate the first data stream with the first IC chip;
        a third data interface comprising a third set of N I/O pads of a second pad pitch that is greater than the first pad pitch and configured to carry a second data stream of the first data, wherein each of the N I/O pads is configured to operate at a first data rate that is M times higher than a second data rate associated with the second set of M×N I/O pads; and
        multiplexer/de-multiplexer circuitry disposed between the second data interface and the third data interface, wherein
        the multiplexer/de-multiplexer circuitry is configured to multiplex at least a first portion of the first data stream into a first portion of the second data stream, and to de-multiplex at least a second portion of the second data stream into a second portion of the first data stream.

2. The system in a package of claim 1, wherein the USR IC chip is disposed in a planar arrangement with the first IC chip.

3. The system in a package of claim 1, further comprising:
    a substrate; and
    wherein the first IC chip and the USR IC chip are disposed on the substrate.

4. The system in a package of claim 3, wherein the substrate comprises an organic printed circuit board (PCB) material.

5. The system in a package of claim 4, further comprising:
    a mold material disposed on the substrate; and
    wherein the first IC chip and the USR IC chip are embedded in the mold material.

6. The system in a package of claim 1, wherein the first set of M×N I/O pads and the second set of M×N I/O pads include micro (μ) bumps.

7. The system in a package of claim 3, further comprising:
a second IC chip; and
wherein the third set of N I/O pads of the third data interface are coupled to the second IC chip through traces formed in the substrate.

8. The system in a package of claim 1, further comprising:
a substrate including traces;
a second IC chip; and
wherein the first IC chip is stacked with the USR IC chip, and the USR IC chip is disposed on the substrate and is coupled to the second IC chip via the traces of the substrate.

9. The system in a package of claim 1, wherein the first IC chip is stacked with a plurality of second IC chips.

10. The system in a package of claim 1, wherein the second set of M×N I/O pads are connected to the first set of M×N I/O pads through vertical electrical connections.

11. A system in a package comprising:
a first integrated circuit (IC) chip comprising:
a first data interface comprising a first set of M×N internal I/O pads, wherein M and N are positive integers, the first data interface configured to carry a first data stream;
an ultra short reach (USR) IC chip embedded in a mold material together with the first IC chip to form a first multi-die IC module, the first multi-die IC module including re-distribution routing layers, the USR IC chip comprising:
a second data interface comprising a second set of M×N internal I/O pads connected to the first data interface through at least a portion of the re-distribution routing layers to communicate the first data stream with the first IC chip;
a third data interface comprising a third set of N I/O pads configured to carry a second data stream, wherein each of the N I/O pads is configured to operate at a first data rate that is M times higher than a second data rate associated with each of the second set of M×N internal I/O pads; and
multiplexer/de-multiplexer circuitry disposed between the second data interface and the third data interface, wherein
the multiplexer/de-multiplexer circuitry is configured to multiplex at least a first portion of the first data stream into a first portion of the second data stream, and to de-multiplex at least a second portion of the second data stream into a second portion of the first data stream.

12. The system in a package of claim 11, wherein the first multi-die IC module is configured to operate at the first data rate per I/O pad via the third data interface.

13. The system in a package of claim 12, further comprising:
a substrate including traces;
a second IC chip; and
wherein the first multi-die IC module is disposed on the substrate and is coupled to the second IC chip via the third data interface through the traces of the substrate.

14. The system in a package of claim 12, further comprising:
a second USR IC chip and a second IC chip embedded in the mold material to form a second multi-die IC module; and
wherein the USR IC chip, and the second USR IC chip are connected to each other using high speed traces over through mold vias formed in the mold material.

15. The system in a package of claim 11, wherein each of the N I/O pads is coupled to external I/O bumps that are configured as standard flip chip (FC) bumps.

16. A system in a package comprising a first integrated circuit (IC) chip and an ultra short reach (USR) IC chip, the system in a package configured to:
receive a first data stream comprising M×N bits over a first data interface, wherein the first data interface is connected to a first set of M×N input/output (I/O) pads coupled to the first IC chip, wherein M and N are positive integers;
multiplex the M×N bits in the first data stream into a second data stream over a second data interface, wherein the second data interface is connected to a second set of N I/O pads coupled to the USR IC chip and configured to operate at M times higher throughput per I/O pad than the first set of M×N I/O pads; and
transmit the second data stream to a third set of N I/O pads of a second IC chip over N traces of a substrate,
wherein the second IC chip de-multiplexes the second data stream into M×N bits.

17. The system in a package of claim 16, wherein the USR IC chip is a first USR IC chip and the second IC chip is a second USR IC chip comprising the third set of N I/O pads configured to receive the second data stream.

18. The system in a package of claim 16, wherein the first IC chip comprises a memory chip and the second IC chip comprises a processor comprising the third set of N I/O pads configured to receive the second data stream.

* * * * *